US012748006B2

(12) United States Patent
Chien et al.

(10) Patent No.: US 12,748,006 B2
(45) Date of Patent: Sep. 29, 2026

(54) SENSING SYSTEM ON CHIP AND THE MANUFACTURING METHOD THEREOF

(71) Applicant: National Tsing Hua University, Hsinchu (TW)

(72) Inventors: Tung-Lin Chien, Hsinchu (TW); Ya-Chu Lee, Hsinchu (TW); Wei-Leun Fang, Hsinchu (TW)

(73) Assignee: NATIONAL TSING HUA UNIVERSITY, Hsinchu City (TW)

( * ) Notice: Subject to any disclaimer, the term of this patent is extended or adjusted under 35 U.S.C. 154(b) by 541 days.

(21) Appl. No.: 18/296,413

(22) Filed: Apr. 6, 2023

(65) Prior Publication Data

US 2024/0162098 A1 May 16, 2024

(30) Foreign Application Priority Data

Nov. 11, 2022 (TW) ................................ 111143282

(51) Int. Cl.
*G01L 19/00* (2006.01)
*G01L 9/00* (2006.01)

(52) U.S. Cl.
CPC ........ *G01L 19/0092* (2013.01); *G01L 9/0073* (2013.01); *B81B 2201/0214* (2013.01); *B81B 2201/0264* (2013.01); *B81B 2201/0278* (2013.01)

(58) Field of Classification Search
CPC .... B81B 2201/0214; B81B 2201/0264; B81B 2201/0278; B81B 2201/0292; G01N 27/223; G01L 9/0073; G01L 19/0092; G01L 2027/222; G01L 9/0041-008; G01L 13/025; G01L 13/026
See application file for complete search history.

(56) References Cited

U.S. PATENT DOCUMENTS

| | | | | |
|---|---|---|---|---|
| 6,425,290 | B2 * | 7/2002 | Willcox ................ | G01L 9/0007 73/715 |
| 9,176,089 | B2 * | 11/2015 | Le Neel ............... | H10D 84/143 |
| 9,594,041 | B2 * | 3/2017 | Koo ........................ | G01R 27/26 |
| 9,845,236 | B2 * | 12/2017 | Yu .......................... | G01L 9/0073 |
| 10,107,773 | B2 * | 10/2018 | El-Gamal ............ | G01N 27/223 |
| 10,246,322 | B2 * | 4/2019 | Gogoi ..................... | H10B 61/00 |
| 11,674,916 | B2 * | 6/2023 | Udrea .................. | G01N 27/128 422/82.02 |

* cited by examiner

*Primary Examiner* — Justin N Olamit
(74) *Attorney, Agent, or Firm* — Volpe Koenig

(57) ABSTRACT

A sensing system on chip (SOC) is disclosed. The sensing system on chip (SOC) includes a substrate, a humidity sensing unit, an air pressure sensing unit and a gas sensing unit. The substrate has a plane. The humidity sensing unit is formed on the substrate. The air pressure sensing unit is formed on the substrate. The gas sensing unit is formed on the substrate, wherein the humidity sensing unit, the air pressure sensing unit and the gas sensing unit are all arranged on the plane.

5 Claims, 8 Drawing Sheets

SENSING SYSTEM ON CHIP AND THE MANUFACTURING METHOD THEREOF

CROSS-REFERENCE TO RELATED APPLICATION AND CLAIM OF PRIORITY

The application claims the benefit of Taiwan Application No. 111143282, filed on Nov. 11, 2022, at the TIPO, the disclosures of which are incorporated herein in their entirety by reference.

FIELD OF THE INVENTION

The present invention relates to sensing elements, and particularly to sensing elements fabricated using a CMOS platform.

BACKGROUND OF THE INVENTION

Handheld electronic devices, such as mobile phones, are now indispensable for modern people. In the past, environmental sensors on mobile phones only sensed temperature, humidity, and pressure. However, in recent years, attention to air quality has gradually increased, so it is also necessary to add the function of gas sensing. In the early days, various sensors were disposed on the motherboard of the mobile phone individually. However, this method would occupy a considerable amount of space on the motherboard. Later, the system in a package (SiP) was used to greatly reduce the volume occupied by various sensors on the motherboard. In addition, the SiP can reduce the complexity of the printed circuit board wiring; that is, the sensing elements having different functions are packaged into an integrated circuit, which can reduce the number of integrated circuits on the printed circuit board and reduce the complexity of the circuit. However, the pursuit of reducing the cost of end products is still there, so a solution to integrate various sensing elements with the system-on-chip (SoC) technology has now emerged as the latest requirement. The advantages of a system-on-chip are to reduce the volume, reduce the cost, reduce the power consumption and increase the computing speed, and improve system functions. Combining several integrated circuits having different functions on a printed circuit board results in a larger volume. If several integrated circuits having different functions are integrated into one SoC chip, the volume becomes smaller. It is necessary to package and test multiple integrated circuits, which results in a higher cost. If multiple integrated circuits are integrated into one SoC chip, only one integrated circuit needs to be packaged and tested, which has a lower cost. If several integrated circuits having different functions are combined on a printed circuit board, electrical signals must be transmitted on the printed circuit board for a long distance before the computing can be performed. In this way, the power consumption is higher, and the computing speed is slower. If several integrated circuits having different functions are integrated into one SoC chip, the electrical signal can be transmitted in the same integrated circuit for a shorter distance to perform calculations, which has a lower power consumption and a faster computing speed. Integrated circuits having different functions are integrated into one SoC chip, which is smaller in size and can integrate more "functional units" to form a more powerful chip. There are already many very successful SoC chips on the market, such as the Tegra 650 multimedia system single chip designed by Nvidia (NVDA-US), which combines a central processing unit (CPU), a graphics processing unit (GPU), an image processing unit (Image/Video processor), other peripheral interfaces and other functional units.

However, SoC chips also have manufacturing bottlenecks. Different functional units have different process technologies, and it is very difficult to manufacture them on a silicon chip at the same time. It is easier to integrate digital circuits, but it is more difficult to integrate both digital and analog circuits.

In order to overcome the drawbacks in the prior art, a sensing system on chip and the manufacturing method thereof are disclosed. The particular design in the present invention not only solves the problems described above, but also is easy to implement. Thus, the present invention has utility for the industry.

SUMMARY OF THE INVENTION

In order to integrate several sensing units together so that the volume can be reduced and the cost of the end product is reduced, the present invention provides the "sensing system single chip and its manufacturing method", multiple sensing units are simultaneously manufactured through a CMOS platform to achieve the desired efficacy above, i.e., the unit used for temperature, humidity, air pressure, and gas sensing is integrated into a single chip by the CMOS post-processing.

In accordance with one aspect of the present invention, a sensing system on chip (SOC) is disclosed. The sensing system on chip (SOC) includes a substrate, a thermometer, a humidity sensing unit, an air pressure sensing unit and a gas sensing unit. The substrate is built on a CMOS platform. The thermometer is formed on the substrate. The humidity sensing unit is formed on the substrate and having a first heating unit. The air pressure sensing unit is formed on the substrate. The gas sensing unit is formed on the substrate and having a second heating unit, wherein the humidity sensing unit, the air pressure sensing unit, and the gas sensing unit are longitudinally distributed along the substrate.

In accordance with another aspect of the present invention, a method of manufacturing a sensing system on chip (SOC) is disclosed. The method includes the following steps: providing a substrate; and forming a humidity sensing unit, an air pressure sensing unit, and a gas sensing unit on the substrate, wherein the air pressure sensing unit on the substrate is formed before completing forming the humidity sensing unit; and the gas sensing unit on the substrate is formed before completing forming the humidity sensing unit and the air pressure sensing unit.

In accordance with a further aspect of the present invention, a sensing system on chip (SOC) is disclosed. The sensing system on chip (SOC) includes a substrate, a humidity sensing unit, an air pressure sensing unit and a gas sensing unit. The substrate has a plane. The humidity sensing unit is formed on the substrate. The air pressure sensing unit is formed on the substrate. The gas sensing unit is formed on the substrate, wherein the humidity sensing unit, the air pressure sensing unit and the gas sensing unit are all arranged on the plane.

BRIEF DESCRIPTION OF THE DRAWINGS

The above objectives and advantages of the present invention will become more readily apparent to those ordinarily skilled in the art after reviewing the following detailed descriptions and accompanying drawings, in which:

FIG. 4(*b*) is a cross-sectional view of the gas sensing unit according to a preferred embodiment of the present invention;

DETAILED DESCRIPTION OF THE PREFERRED EMBODIMENTS

Please read the following detailed description with reference to the accompanying drawings of the present invention. The accompanying drawings of the present invention are used as examples to introduce various embodiments of the present invention and to understand how to implement the present invention. The embodiments of the present invention provide sufficient content for those skilled in the art to implement the embodiments of the present invention, or implement embodiments derived from the content of the present invention. It should be noted that these embodiments are not mutually exclusive with each other, and some embodiments can be appropriately combined with another one or more embodiments to form new embodiments; that is, the implementation of the present invention is not limited to the examples disclosed below. In addition, for the sake of brevity and clarity, relevant details are not excessively disclosed in each embodiment, and even if specific details are disclosed, examples are used only to make readers understand. The present invention will now be described more specifically with reference to the following embodiments. It is to be noted that the following descriptions of the preferred embodiments of this invention are presented herein for the purposes of illustration and description only; they are not intended to be exhaustive or to be limited to the precise form disclosed.

Figure 1:
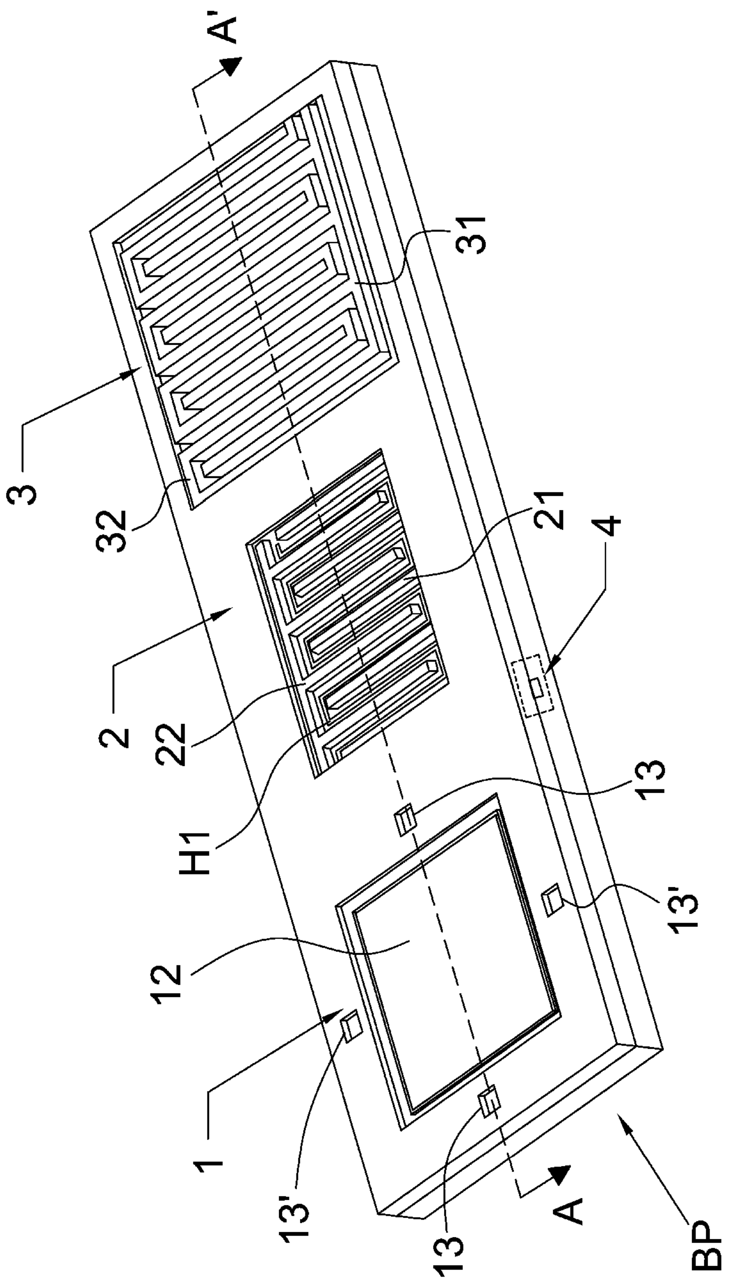
FIG. 1 is a schematic diagram showing a three-dimensional schematic diagram of a sensing unit which integrates the air pressure, gas, humidity and temperature by using a CMOS platform as a substrate.
Figure 4B:
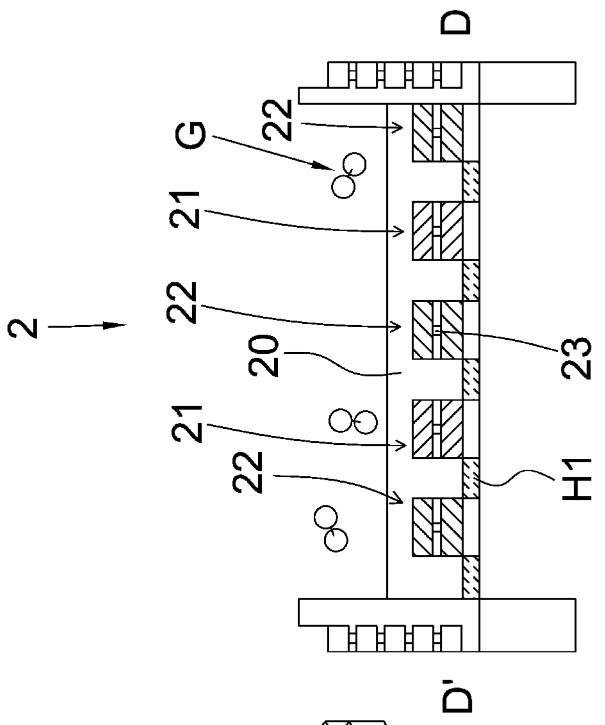
FIG. 4(*a*) is a three-dimensional schematic view of the gas sensing unit according to a preferred embodiment of the present invention.
Figure 4A:
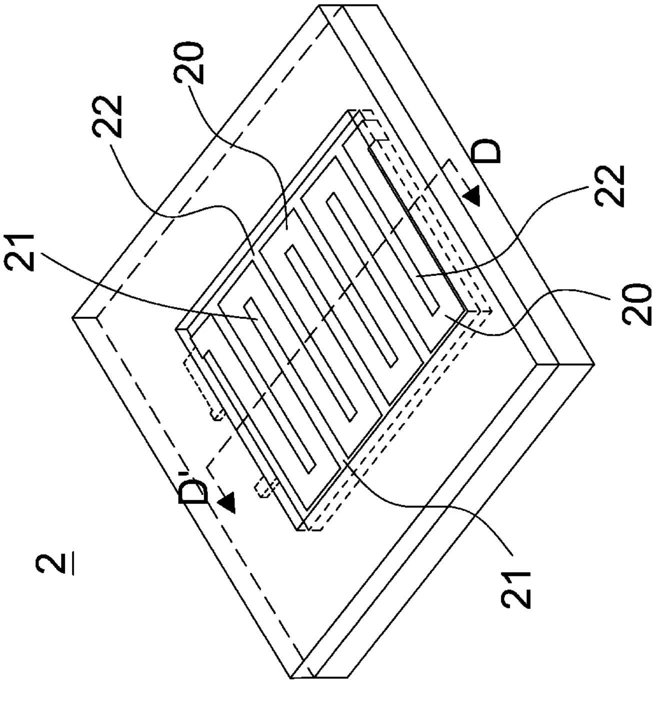

Please refer to FIG. 1, which is a schematic diagram showing a three-dimensional schematic diagram of a sensing unit which integrates the air pressure, gas, humidity and temperature by a CMOS platform serving as a substrate. FIG. 1 discloses a pressure sensing unit 1, a gas sensing unit 2, a humidity sensing unit 3 and a thermometer 4 of the present invention using a CMOS platform as a substrate BP. Each sensing unit actually has common materials used, especially for electronic components such as capacitors and inductors. For example, the metal layers required for two or three elements are formed together in one deposition (please refer to FIG. 2 and its related descriptions), and then the materials of the stacked structure of each unit are processed in turn in subsequent processing procedures (such as a CMOS post-process). In other words, the area to be used by each sensing unit can be divided on the CMOS platform to form a stacked structure of the materials required for each sensing unit, and then each sensing unit is shaped by a CMOS post-process. As shown in FIG. 1, the air pressure sensing unit 1 has an exposed second film 12, while the gas sensing unit 2 shows the structure after removing the gas absorbing material; that is, the first gas sensing electrode 21, the second gas sensing electrode 22, and a heating unit H1 are exposed. The first heating unit H1 can heat the first gas sensing electrode 21, the second gas sensing electrode 22, and the gas absorbing material 20 (as shown in FIGS. 4(*a*) and 4(*b*)) to reach the working temperature. As for the humidity sensing unit 3, it is an air capacitor, which discloses a first humidity sensing electrode 31 and a second humidity sensing electrode 32, wherein the second humidity sensing electrode 32 can be made of a resistive material, so it also has a heating function in order to drive off the humidity attached to the humidity sensing unit 3 by heating, i.e. to make the humidity sensing unit 3 return to zero to facilitate the next sensing. Moreover, the first humidity sensing electrode 31 and the second humidity sensing electrode 32 of the humidity sensing unit 3 are substantially disposed on a stage 30.

Figure 2:
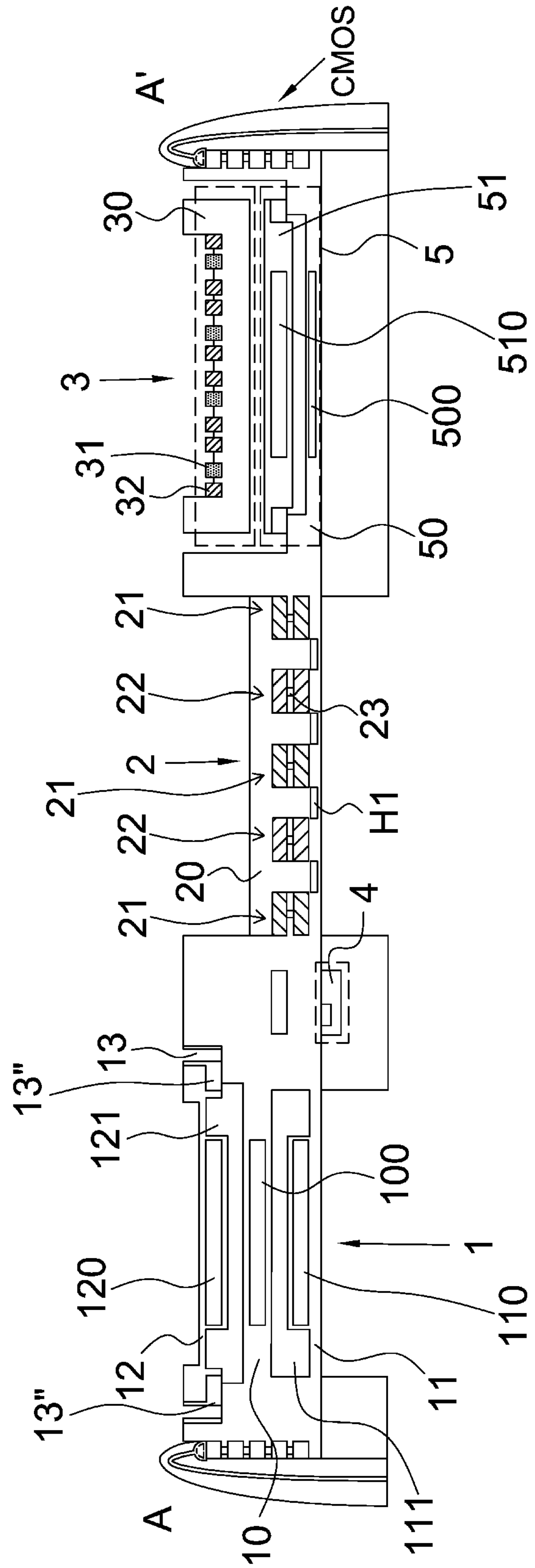
FIG. 2 is a schematic diagram of a side cross-sectional view of the line segment AA' in FIG. 1 according to a preferred embodiment of the present invention.
Figure 3:
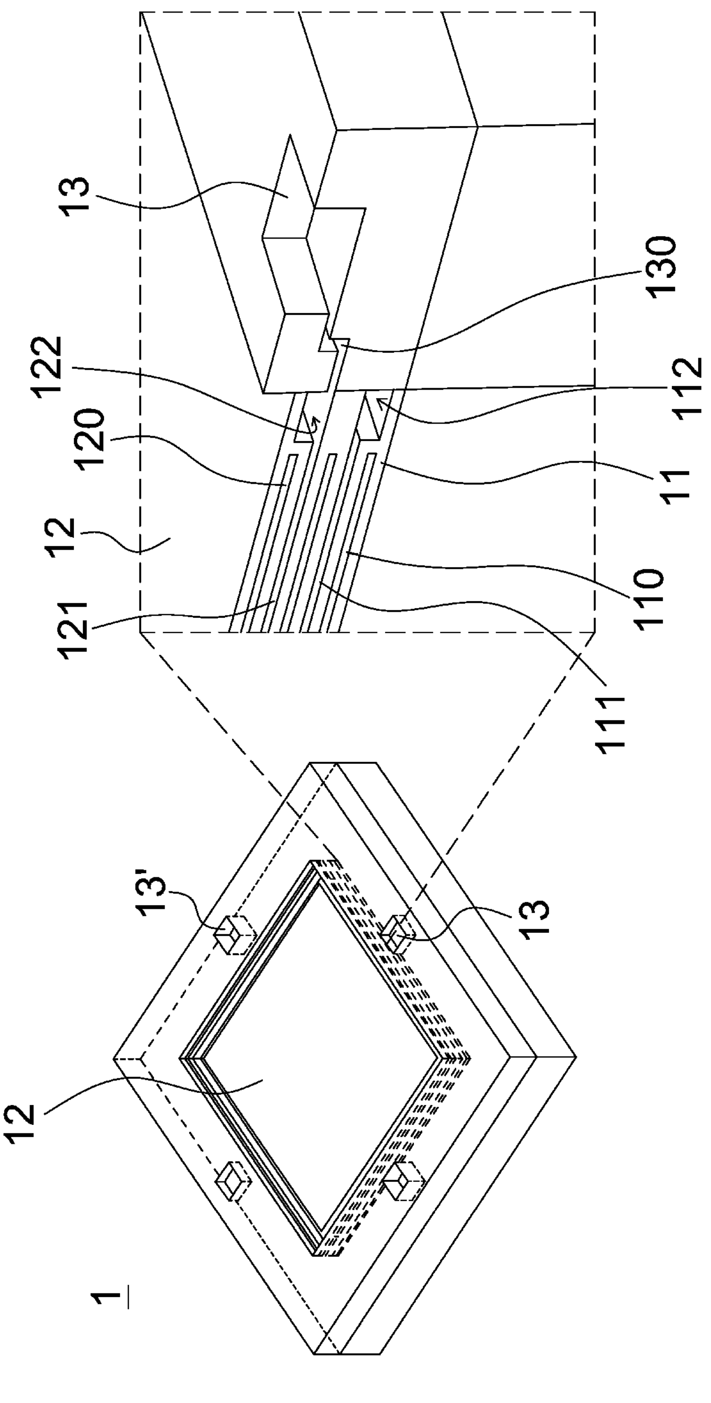
FIG. 3 is a partial three-dimensional schematic diagram of the air pressure sensing unit according to a preferred embodiment of the present invention.

Please refer to FIGS. 2 and 3. FIG. 2 is a schematic side cross-sectional view of the line segment AA' in FIG. 1, and FIG. 3 is a partial three-dimensional view of the air pressure sensing unit. Firstly, regarding the air pressure sensing unit 1, it includes a first film layer 11, a first cavity layer 111, a fixed structure layer 10, a second cavity layer 121 and a second film layer 12 from bottom to top. There is a first film electrode 110 in the first film layer 11, and the first film electrode 110 has a certain degree of flexibility to adapt to the deformation of the first film layer 11. There is a second film electrode 120 in the second film layer 12, and the second film electrode 120 has a certain flexibility to adapt to the deformation of the second film layer 12. The fixed structure 10 also has a fixed electrode 100. It can be seen that through the multilayer electrodes, i.e. the first film electrode 110, the fixed electrode 100 and the layered structure of the second film electrode 120, due to a double film design, the area of the film for sensing the air pressure is two times that in the conventional technology having only a single film, thereby improving the sensitivity. In addition, through the first groove 112 and the second groove 122 around the first film layer 11 and the second film layer 12, the rigidity of each film layer is reduced, and the softness is increased. The first cavity layer 111 is used as an inwardly-pressed active space of the first film layer 11, i.e. serving as the first chamber 111 after the air pressure sensing unit 1 is completed. The second cavity layer 121 is also used as an inwardly-pressed active space for the second film layer 12, i.e. serving as the second chamber 121 after the air pressure sensing unit 1 is completed. When the first film layer 11 and the second film layer 12 are subjected to air pressure, they will be pressed into the first chamber 111 and the second chamber 121 respectively, so that the first thin film electrode 110 and the second thin film electrode 120 approach the fixed electrode 100 to cause the capacitance value between each film electrode and the fixed electrode to change, and thus the air pressure value are deduced in reverse. The second channel 13 is used as an etching channel to etch the original material of the first cavity layer 111 serving as a sacrificial layer, and discharge waste. Similarly, the first channel 13 is also used as an etching channel to etch the original material of the second cavity layer 121 serving as a sacrificial layer, and discharge waste. The etching flow channel (13, 13') includes a tortuous flow channel 130, which can increase the friction force of the sealing material 13" in the etching flow channel (13, 13') so that the sealing material 13" is easily retained therein. This causes the sealing material 13" to stagnate and solidify in the tortuous flow channel 130 as soon as possible, so as not to excessively penetrate into the cavity layer (111, 121) as much as possible. The sealing material 13" is usually a polymer material. The above-mentioned two cavity layers also seal the pressure of about 10 Pa (10 Pa). If the external air pressure is low, the purpose of measurement can also be achieved; that is, the sealing material 13" is used to maintain the high vacuum state in the two cavities. In addition, another air pressure sensing unit 5 can also be arranged below the humidity sensing unit 3, wherein the fixed end 50 of the air pressure sensing unit 5 is directly located on the platform, a fixed electrode 500 is also arranged in the air pressure sensing unit 5, an elastic layer 51 is arranged above the fixed electrode 500, an elastic electrode 510 is arranged in the elastic electrode 510, the elastic layer 51 is located below the stage 30, and there is a gap (not shown) between the elastic layer 51 and the stage 30 to communicate with the outside atmosphere. When the air pressure of the outside atmosphere passes through the gap between the stage 30 and the elastic layer 51, it will apply pressure to the elastic layer 51, and the elastic layer 51 can be pressed down so that the elastic electrode 510 is close to the fixed electrode 500 to cause a change in the capacitance between the elastic electrode 510 and the fixed electrode 500, and thus the air pressure value are deduced in reverse. There is also a space between the elastic electrode 510 and the fixed electrode 500 to serve as the movable space of the elastic layer 51, and the space has a pressure of about 10 Pa (10 Pa). If the external air pressure is low, the purpose of measurement can also be achieved.

Figure 5:
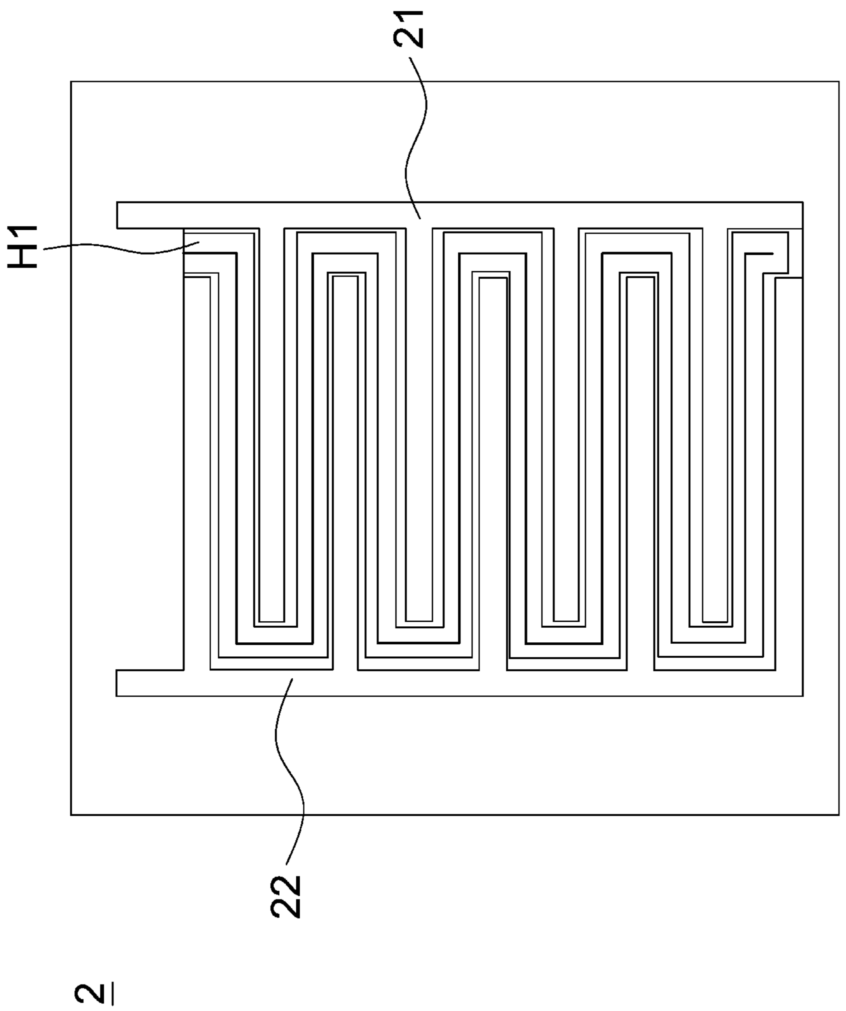
FIG. 5 is a schematic diagram of top view of the gas sensing unit according to a preferred embodiment of the present invention.

Please refer to FIGS. 2, 4(*a*), 4(*b*) and 5. FIG. 2 is a schematic side cross-sectional view of the line segment AA' in FIG. 1. FIG. 4(*a*) is a perspective view of the gas sensing unit 2, and FIG. 4(*b*) is a cross-sectional view of the gas sensing unit 2. FIG. 5 is a top view of the gas sensing unit 2. FIG. 5 discloses that a first gas electrode 21, a second gas electrode 22 and a first heater H1 can be seen after removing the gas absorbing material (the reference numeral 20 in FIGS. 2 and 4). As shown in FIG. 4(*a*), the first gas electrodes 21 and the second gas electrodes 22 are arranged in a staggered manner, and the gap between the first gas electrodes 21 and the second gas electrodes 22 is filled with the gas absorbing material 20. As shown in FIG. 4(*b*), the first heater H1 is configured at the bottom of the gas sensing unit 2, and each of the first gas electrode 21 and the second gas electrode 22 has a layered structure. FIGS. 4(*a*) and 4(*b*) disclose a double-layer structure, but it is not limited thereto, and the two layers are electrically connected to each other by a conductor 23. The gas-absorbing material 20 is filled between the electrodes and located above the first heater H1. If the target gas G is oxygen, the choice of the gas absorbing material is zinc oxide-tin dioxide (ZnO—SnO2), and if the target gas is other gases, then other gas absorbing materials can be chosen. The first heater H1 is used to heat the gas sensing unit 2 to cause it to reach the working temperature. In addition, the length of the comb teeth of the first gas electrode 21 and the second gas electrode 22 is about 100 microns, the span of the comb structure is about 130 microns, and the adjacent comb teeth are about 10 microns. As for the first heater Hlmade of polysilicon, the line width thereof is about 2 microns.

Figure 6:
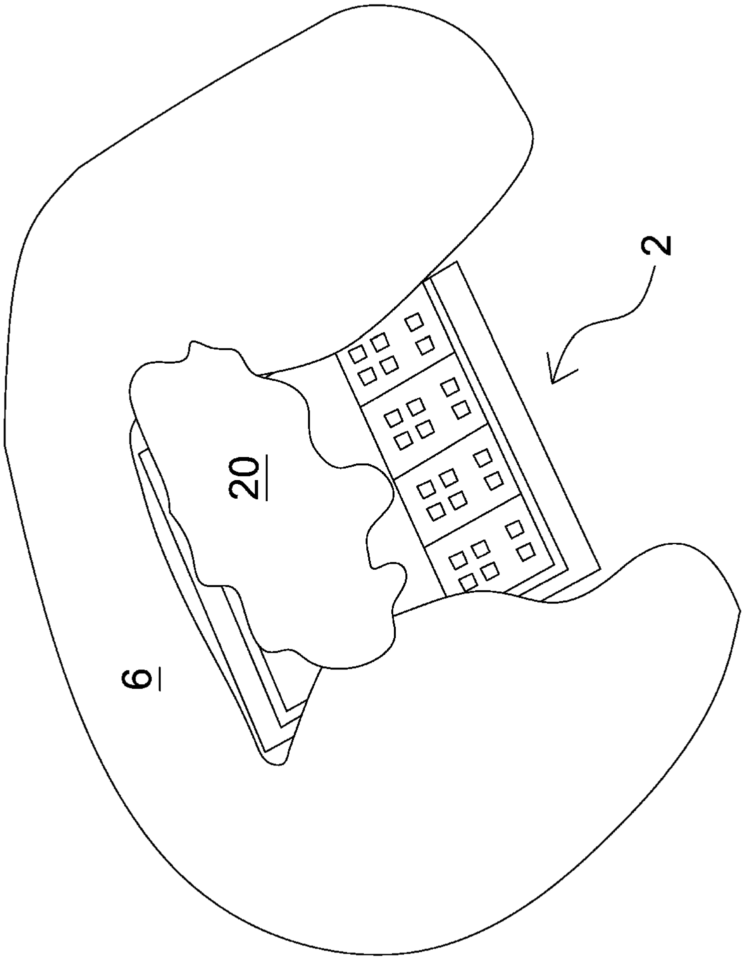
FIG. 6 is a schematic diagram of the final manufacture stage of the gas sensing unit according to a preferred embodiment of the present invention.

Please refer to FIG. 6, which is a schematic diagram of the gas sensing unit 2 at the final stage of manufacture according to a preferred embodiment of the present invention, wherein the gas absorbing material 20 is formed on the second gas electrode 22 and the first heater H1. The surroundings of the gas sensing unit 2 is covered with epoxy resin 6 for protection.

Figure 7:
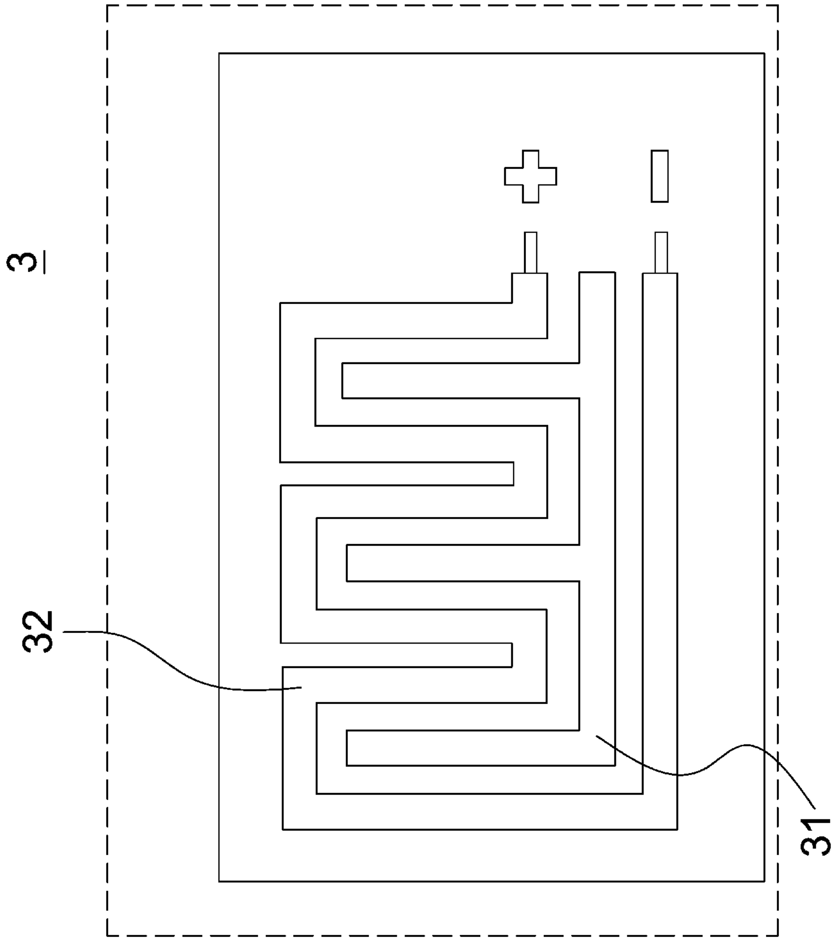
FIG. 7 is a schematic diagram of top view of the humidity sensing unit according to a preferred embodiment of the present invention.

Please refer to FIGS. 2 and 7. FIG. 2 is a schematic side cross-sectional view of the line segment AA' in FIG. 1, and FIG. 7 is a top view of the humidity sensing unit 3. It can be seen that the second humidity sensing electrode 32 of the humidity sensing unit 3 surrounds the first humidity sensing electrode 31. The distance between the first humidity sensing electrode 31 and the second humidity sensing electrode 32 is close enough, about 0.6 microns, and the line width of the first humidity sensing electrode 31 is about 0.6 microns. As for the line width of the second humidity sensing electrode 32, it is about 1 micron so that there is an effect of air capacitance between the first humidity sensing electrode 31 and the second humidity sensing electrode 32. If the second humidity sensing electrode 32 is energized, the humidity sensing unit 3 can be heated to drive away the moisture inside; that is, the humidity sensing unit 3 is reset to zero to facilitate the next sensing. From the above descriptions and FIG. 2, it can be seen that the first film electrode 110, the fixed electrode 500, and the gas electrodes 21, 22 are substantially located on the same layer; that is, the heights of the first film electrode 110, the fixed electrode 500, and the gas electrodes 21, 22 on the CMOS platform are substantially the same. Similarly, the second film electrode 120, the first humidity sensing electrode 31, and the second humidity sensing electrode 32 are also substantially located on the same layer; that is, the heights of the second film electrode 120, the first humidity sensing electrode 31, and the second humidity sensing electrode 32 on the CMOS platform are substantially the same, so the metal layers substantially located on the same height and required by the air pressure sensing unit 1, the gas sensing unit 2 and the humidity sensing unit 3 are formed together in one deposition, and then the materials of the stacked structure of each unit are processed in turn in subsequent processing procedures (such as the CMOS post-processing).

Figure 8:
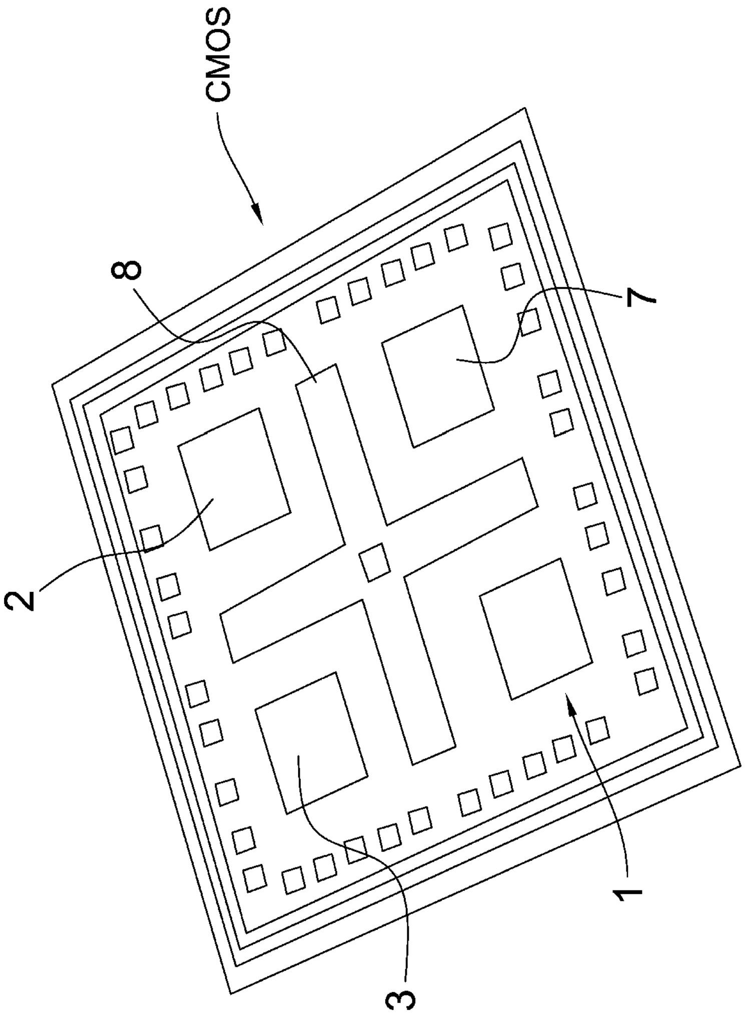
FIG. 8 is a schematic diagram of another planar distribution design according to a preferred embodiment of the present invention.

Please refer to FIG. 8, which is a schematic diagram of another planar distribution design according to a preferred embodiment of the present invention. The air pressure sensing unit 1, the gas sensing unit 2, the humidity sensing unit 3 and other sensing elements 7 are distributed in front, back, left and right. As for the cross part in the middle, it is an anemometer 8, which can measure the wind direction and the wind speed. The above other sensing elements 7 can be photosensors or temperature sensors. In other words, horizontally arranging the stacked structure of each sensing unit on the CMOS platform is very beneficial to the processing of each stacked structure; that is, the etching mask and the protective layer can be manufactured by separate areas and by separate times, or the structure of each sensing unit can also be manufactured by separate areas at the same time. It can be seen that the design and processing of horizontally arranging each sensing unit on the CMOS platform is far more flexible, less time-consuming, and more convenient and easier to manufacture than the vertical arrangement of the sensing units.

To sum up, the present invention utilizes the CMOS platform to horizontally arrange the stacked structures of the sensing units, and process each stacked structure in turn through the CMOS post-process. It can be seen that this present invention uses the system on chip (SoC) technology to integrate various sensing element solutions to reduce the volume, reduce the cost, reduce the power consumption, increase the computing speed, and improve system functions. Therefore, the present invention can be a great contribution to related industries.

While the invention has been described in terms of what is presently considered to be the most practical and preferred embodiments, it is to be understood that the invention need not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:

1. A sensing system on chip (SOC), comprising:
- a substrate built on a CMOS platform;
- a thermometer formed on the substrate;
- a humidity sensing unit formed on the substrate and having a first heating unit and an electrode layer;
- an air pressure sensing unit formed in a double film design on the substrate and including:
  - a fixed structure being flat and having a first surface, a second surface opposite to the first surface and a fixed electrode;
  - a first film facing the first surface and having a first film electrode, wherein a first cavity is formed between the first film and the fixed structure; and
  - a second film facing the second surface and having a second film electrode, wherein a second cavity is formed between the second film and the fixed structure; and
- a gas sensing unit formed on the substrate and having a second heating unit, wherein the humidity sensing unit, the air pressure sensing unit, and the gas sensing unit are horizontally distributed along the substrate, and the second film electrode of the air pressure sensing unit and the electrode layer of the humidity sensing unit are substantially located on the same layer in the sensing SOC.

2. The sensing SOC as claimed in claim 1, wherein the humidity sensing unit has a film layer including the electrode layer and the first heating unit.

3. The sensing SOC as claimed in claim 1, wherein the humidity sensing unit is an air capacitor, the electrode layer has a first humidity sensing electrode and a second humidity sensing electrode, and the second humidity sensing electrode is arranged around an outline of the first humidity sensing electrode.

4. The sensing SOC as claimed in claim 1, wherein the fixed electrode is embedded in the fixed structure and formed between the first surface and the second surface.

5. The sensing SOC as claimed in claim 1, wherein the first film electrode is embedded in the first film and the second film electrode is embedded in the second film.

* * * * *